(12) United States Patent
Westrelin et al.

(10) Patent No.: US 7,647,436 B1
(45) Date of Patent: Jan. 12, 2010

(54) METHOD AND APPARATUS TO INTERFACE AN OFFLOAD ENGINE NETWORK INTERFACE WITH A HOST MACHINE

(75) Inventors: Roland Westrelin, Grenoble (FR); Erik Nordmark, Mountain View, CA (US); Nicolas Fugier, Grenoble (FR); Eric Lemoine, Theys (FR)

(73) Assignee: Sun Microsystems, Inc., Santa Clara, CA (US)

( * ) Notice: Subject to any disclaimer, the term of this patent is extended or adjusted under 35 U.S.C. 154(b) by 523 days.

(21) Appl. No.: 11/118,004

(22) Filed: Apr. 29, 2005

(51) Int. Cl.
*G06F 13/00* (2006.01)
*G06F 3/00* (2006.01)
*G06F 13/28* (2006.01)
*G06F 15/16* (2006.01)
*G06F 11/00* (2006.01)
*G01R 31/08* (2006.01)
*G08C 15/00* (2006.01)
*H04J 1/16* (2006.01)
*H04J 3/14* (2006.01)
*H04L 1/00* (2006.01)
*H04L 12/26* (2006.01)

(52) U.S. Cl. .............................. 710/33; 710/20; 710/22; 709/230; 370/235

(58) Field of Classification Search .................. 710/20, 710/22, 33; 709/230; 370/235
See application file for complete search history.

(56) References Cited

U.S. PATENT DOCUMENTS

| | | | | |
|---|---|---|---|---|
| 2003/0154346 A1* | 8/2003 | Gruner et al. | ............... | 711/130 |
| 2004/0042464 A1* | 3/2004 | Elzur et al. | ............ | 370/395.52 |
| 2004/0062245 A1* | 4/2004 | Sharp et al. | ................. | 370/392 |
| 2004/0103225 A1* | 5/2004 | McAlpine et al. | ............. | 710/52 |
| 2004/0258075 A1* | 12/2004 | Sidenblad et al. | ........ | 370/395.5 |
| 2005/0254519 A1* | 11/2005 | Beukema et al. | ............ | 370/468 |
| 2006/0015618 A1* | 1/2006 | Freimuth et al. | ............ | 709/226 |
| 2006/0067346 A1* | 3/2006 | Tucker et al. | ............... | 370/412 |
| 2006/0104308 A1* | 5/2006 | Pinkerton et al. | ........... | 370/469 |
| 2006/0126619 A1* | 6/2006 | Teisberg et al. | ............. | 370/389 |
| 2006/0168384 A1* | 7/2006 | Radhakrishnan et al. | .... | 710/260 |
| 2006/0248234 A1* | 11/2006 | Pope et al. | ................. | 709/250 |
| 2006/0251109 A1* | 11/2006 | Muller et al. | ............... | 370/463 |

OTHER PUBLICATIONS

Alexandrov, et al.; "LogGP: Incorporating Long Messages into the LogP Model for Parallel Computation"; Journal of Parallel and Distributed Computing 44; pp. 71-79 (1997); Article No. PC971346 (9 pages).

(Continued)

*Primary Examiner*—Niketa Patel
*Assistant Examiner*—Farley J Abad
(74) *Attorney, Agent, or Firm*—Osha • Liang LLP

(57) ABSTRACT

A system that includes a host including at least one per-connection data structure and at least one per-processor data structure, wherein the at least one per-connection data structure is associated with a connection, and an offload engine operatively connected to the host. The engine includes offload engine connection registers and functionality to update the at least one per-connection data structures in the host, wherein the offload engine is configured to send and receive network data on the connection, wherein the host and the offload engine communicate using the at least one per-processor data structure, and wherein the offload engine communicates a status of the connection to the host using the offload engine connection registers.

18 Claims, 5 Drawing Sheets

OTHER PUBLICATIONS

Nahum, E. et al.; "Performance Issues in Parallelized Network Protocols"; Proceedings of the First Symposium on Operating Systems Design and Implementation, Usenix Association, Nov. 1994 (13 pages).

Zitterbart; "A Multiprocessor Architecture for High Speed Network Interconnections"; IEEE 1989; pp. 212-218 (7 pages).

Boden, et al.; "Myrinet—A Gigabet-per-Second Local-Area Network"; Myricom, Inc., www.myri.com; IEEE Micro Feb. 1995; pp. 1-15 (15 pages).

Bonwick, et al.; "Magazines and Vmem: Extending the Slab Allocator to Many CPUs and Arbitrary Resources"; Usenix Annual Technical Conference; pp. 15-33; 2001 (19 pages).

Buonadonna, et al.; "Queue Pair IP: A Hybrid Architecture for System Area Networks"; Proceedings of ISCA 2002; May 2002 (10 pages).

Callaghan, et al.; "NFS over RDMA"; Workshop on Network-I/O Convergence: Experience, Lessons, Implications (NICELI), Aug. 2003 (13 pages).

Charlesworth, Alan; "The Sun Fireplane System Interconnect"; SC2001 Nov. 2001, Denver, ACM 2001; (14 pages).

Chase, et al.; "End System Optimizations for High-Speed TCP"; TCP Performance in Emerging High-Speed Networks; IEEE 2001; IEEE Communications Magazine Apr. 2001; pp. 68-74 (7 pages).

Chesson, Greg; "XTP/PE Design Considerations"; Workshop on Protocols for High-Speed Networks, May 1989 (6 pages).

Chu, H.K. Jerry; "Zero-Copy TCP in Solaris"; Proceedings of the USENIX 1996 Annual Technical Conference, Jan. 1996 (13 pages).

Clark, et al.; "An Analysis of TCP Processing Overhead"; IEEE Communications Magazine; Jun. 1989, vol. 27, No. 6, pp. 94-101 (8 pages).

Clark, et al.; "Architectural Considerations for a New Generation of Protocols"; Laboratory for Computer Science, M.I.T.; 1990 ACM; pp. 200-208 (9 pages ).

Bailey, et al.; "The Architecture of Direct Data Placement (DDP) and Remote Direct Memory Access (RDMA) on Internet Protocols"; pp. 1-20, www.ietf.org/internet-drafts/draft-ietf-rddp-arch-07.txt; Feb. 2005 (20 pages).

Pinkerton, J. et al.; "DDP/RDMAP Security" Apr. 2005; pp. 1-48, www.ietf.org/internet-drafts/draft-ietf-rddp-security-07.txt; (48 pages).

Regnier, G. et al.; "ETA: Experience with an Intel® Xeon™ Processor as a Packet Processing Engine"; Intel Corporation; Aug. 2003 (7 pages).

Kanakia, H., et al.; "The VMP Network Adapter Board (NAB): High-Performance Network Communication for Multiprocessors"; 1988 ACM; pp. 175-187(13 pages).

Kay, et al.; "The Importance of Non-Data Touching Processing Overheads in TCP/IP"; Proceedings of SIGCOMM '93; Sep. 1993; (10 pages).

Mogul, Jeffrey C.; "TCP Offload Is A Dumb Idea Whose Time Has Come"; Proceedings of HotOS IX: The $9^{th}$ Workshop on Hot Topics in Operating Systems; May 18-21, 2003, USENIX Association; pp. 25-30 (7pages).

Partridge, Craig; "How Slow Is One Gigabit Per Second?"; ACM Computer Communication Review; pp. 44-53; Jan. 1990 (10 pages).

Sterbenz, et al.; "AXON: A High Speed Communication Architecture for Distributed Applications"; Proceedings of IEEE INFOCOMM'90, Jun. 1990, pp. 415-425 (11 pages).

UltraSPARC® III Cu User's Manual; Sun Microsystems, Version 2.2.1, Jan. 2004, www.sun.com/processors/manuals/USiiiv2.pdf; (732 pages).

* cited by examiner

METHOD AND APPARATUS TO INTERFACE AN OFFLOAD ENGINE NETWORK INTERFACE WITH A HOST MACHINE

BACKGROUND

Network traffic is transmitted over a network, such as the Internet, from a host (e.g., a device capable of receiving data over a network) to another host. Each host uses a specialized piece of hardware commonly referred to as a network interface (NI) to access the network. The NI is a piece of hardware found in a typical computer system that includes functionality to send and receive network traffic. Typically, network traffic is transmitted in the form of packets, where each packet includes a header and a payload. The header contains information regarding the source address, destination address, size, transport protocol used to transmit the packet, and various other identification information associated with the packet of data. The payload contains the actual data to be transmitted from the network to the receiving system. The contents and transmission of the aforementioned packets on the network are typically governed by Transmission Control Protocol (TCP) and Internet Protocol (IP).

Processing TCP/IP traffic requires significant host resources. To decrease the amount of processing required by the host, TCP offload engines (TOE) have been developed. TOEs typically correspond to specialized hardware in chare of executing TCP/IP. The use of a TOE enables the host to offload the execution of TCP/IP, thereby freeing CPU cycles on the host to improve host performance.

SUMMARY

In general, in one aspect, the invention relates to a system, comprising a host comprising at least one per-connection data structure and at least one per-processor data structure, wherein the at least one per-connection data structure is associated with a connection, and an offload engine operatively connected to the host comprising offload engine connection registers and functionality to update the at least one per-connection data structures in the host, wherein the offload engine is configured to send and receive network data on the connection, wherein the host and the offload engine communicate using the at least one per-processor data structure, and wherein the offload engine communicates a status of the connection to the host using the offload engine connection registers.

In general, in one aspect, the invention relates to a method for receiving data, comprising allocating an anonymous receive buffer in a host, wherein the anonymous receive buffer is associated with a descriptor, sending the descriptor to an offload engine operatively connected to the host using a request queue, wherein the request queue is located on the host and is accessible by the offload engine, transferring ownership of the anonymous receive buffer to the offload engine, receiving the data from a network interface card by the offload engine, storing the data in the anonymous receive buffer, placing an event on an event queue, wherein the event queue is located on the host and the event comprises a reference to a connection upon which the data was received, a reference to the anonymous receive buffer, and an amount of data stored in the anonymous receive buffer, issuing an interrupt to the host by the offload engine, transferring ownership of the anonymous receive buffer from the offload engine to the host, upon receiving the interrupt, notifying a processor on the host associated with the connection that data has been received on the connection, and consuming data in the anonymous receive buffer.

In general, in one aspect, the invention relates to a method comprising placing the data in a send buffer, wherein the send buffer is located on a host, posting a send request on the request queue, wherein the send request comprises a descriptor of the send buffer, wherein the request queue is located on the host, notifying an offload engine of the send request by updating a last descriptor posted register in the offload engine, wherein the offload engine is operatively connected to the host, upon receiving the notification, obtaining the descriptor from the host by the offload engine, programming a network interface card to send the data directly from the send buffer to a receiver using the descriptor, sending the data to the receiver by the network interface card, receiving notification of receipt of the data from the receiver by the offload engine, and updating a byte send count register in the offload engine.

Other aspects of the invention will be apparent from the following description and the appended claims.

DETAILED DESCRIPTION

Figure 1:
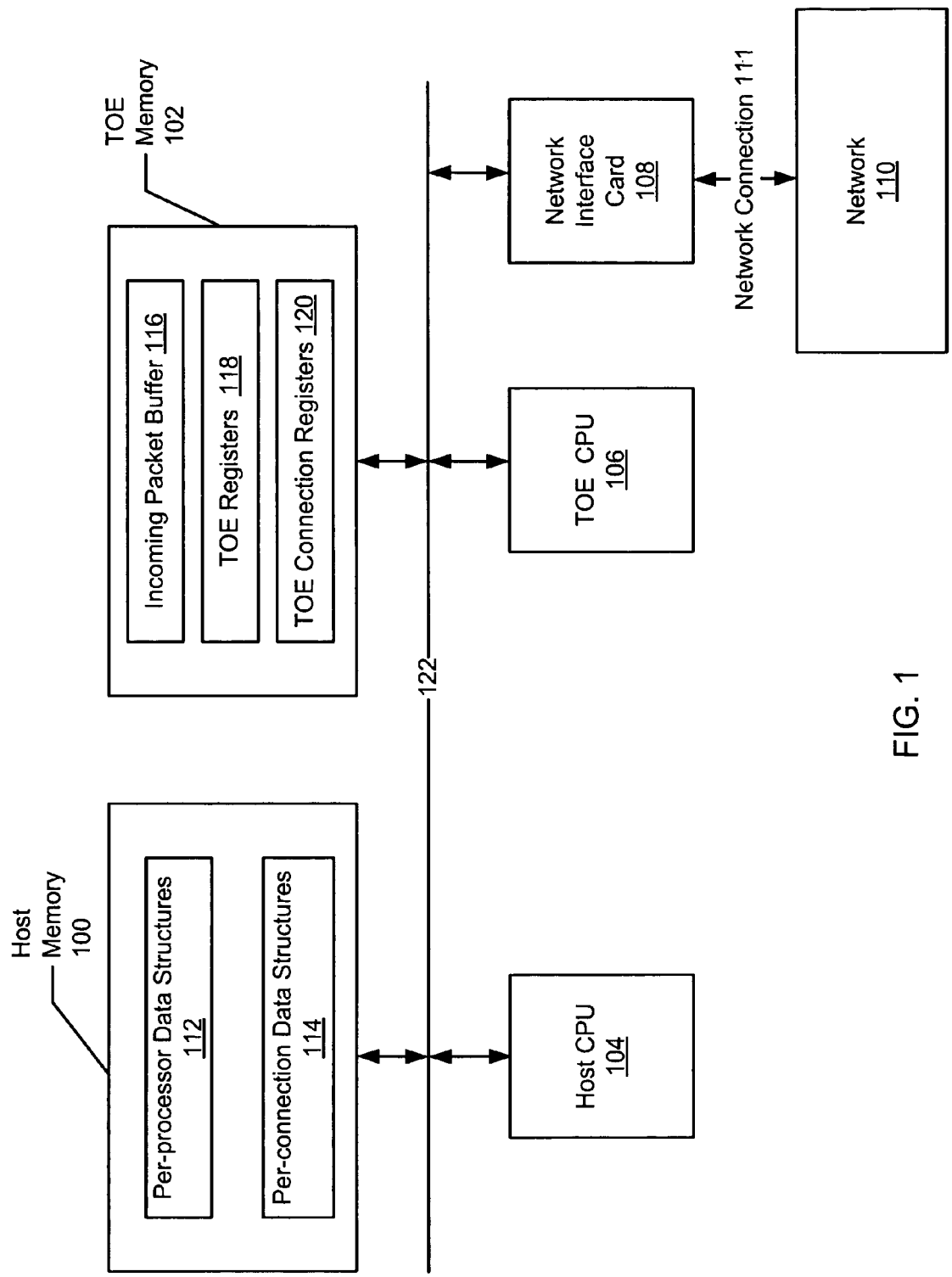
FIGS. 1 and 2 show views of a network system in accordance with one embodiment of the invention.

Exemplary embodiments of the invention will be described with reference to the accompanying drawings. Like items in the drawings are shown with the same reference numbers.

In an embodiment of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In general, embodiments of the invention relate to a method and apparatus for interfacing a host with a TCP offload engine (TOE). More specifically, embodiments of the invention provide per-processor and per-connection data structures to facilitate communication between the host and the TOE as well as to decrease the overhead associated with using the TOE. Further, embodiments of the invention use the per-processor data structures to control the flow of data between the host and the TOE, to notify the host of events (e.g., receiving data from the network, a new connection has been established, etc.) occurring on the TOE, and to communicate error conditions from the TOE to the host. In one or more embodiments of the invention, the host and the TOE use a direct memory access (DMA) mechanism to communicate and transfer data. Further, embodiments of the invention provide software and hardware constructs to interface a host machine to a TOE to support legacy application programming interfaces (APIs) for sockets.

FIG. 1 shows a network system in accordance with one embodiment of the invention. More specifically, the system in FIG. 1 includes a host central processing unit (CPU) (104), an associated host memory (100), and a TOE (101). The TOE (101) includes a TOE CPU (106), an associated TOE memory (102), and a Network Interface (NI) (108). Further, the host (i.e., the combination of the host CPU (104) and the host memory (100)) and the TOE (101) are operatively connected via a bus (122). The aforementioned components are configured to enable the host to send and receive data from a network (110), such as the Internet, via the NI (108) in the TOE (101) and a network connection (111). Flowcharts detailing steps involved in sending and receiving data from the network are described below in FIGS. 4 and 5.

Continuing with the discussion of FIG. 1, the host memory (100) and the TOE memory (102) maintain various data structures used by the host and the TOE (i.e., the combination of the TOE CPU (106) and the TOE memory (102)) to send and receive data from the network (110). More specifically, in one embodiment of the invention, the host memory (100) includes per-processor data structures (112) and per-connection data structures (114). As the names suggest, there is one set of per-processor data structures (112) for each host CPU (104). Similarly, there is one set of per-connection data structures for each connection. In one embodiment of the invention, the connection corresponds to a communicate channel across the network (110) between the host and a receiver. The connection may be established using a socket (e.g., Berkley Software Distribution (BSD) sockets). The socket enables the host and the receiver to engage in inter-process communication (IPC) over the network. Those skilled in the art will appreciate that a given system implementing embodiments of the invention may include any number of host CPU's (and corresponding host memory) and support any number of connections. The specific per-processor data structures (112) and per-connection data structures (114) are described below in FIG. 2.

Continuing with the discussion of FIG. 1, the TOE memory (102) includes the following data structures: an incoming packet buffer (116), TOE registers (118) and TOE connection registers (120). In general, the incoming packet buffer (116) is used to buffer data received via the NI (108) prior to forwarding the data to the host memory (100). The TOE registers (118) and the TOE connection registers (120) are described below in FIG. 2. Those skilled in the art will appreciate that while only one host CPU (104) is shown in FIG. 1, the network system may include multiple host CPUs.

Figure 2:
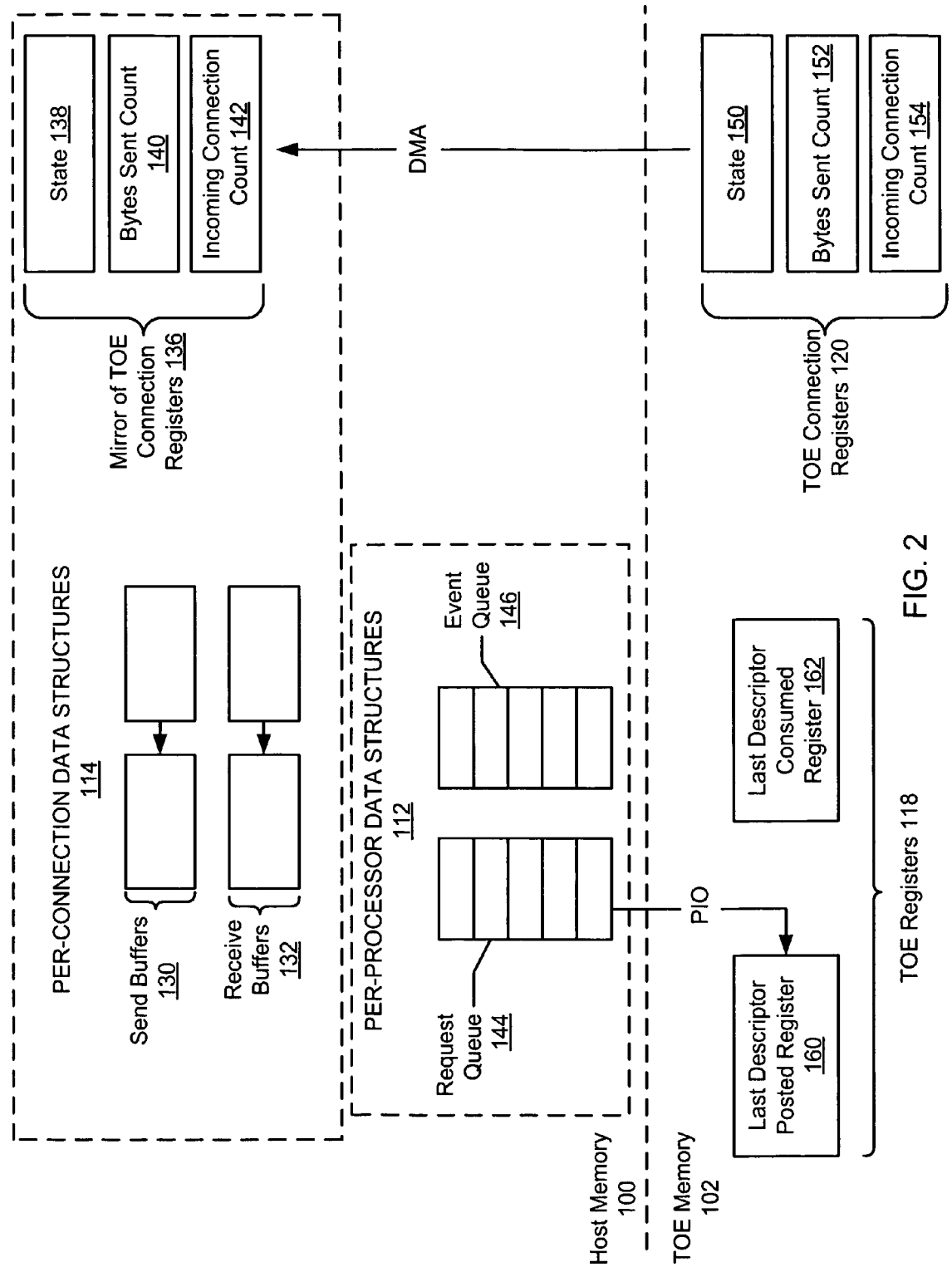

FIG. 2 shows a network system in accordance with one embodiment of the invention. As discussed above, the host memory (100) includes per-connection data structures (114). In one embodiment of the invention, the per-connection data structures (114) include a mirror of TOE connection registers (136) and may have associated send buffer(s) (130) and receive buffer(s) (132). In one embodiment of the invention, the send buffer(s) (130) correspond to a specified number of fixed-size buffer(s) that are allocated on a per-connection basis. The send buffer(s) (130) are typically allocated by a process thread (not shown) in the kernel executing a send operation. In one embodiment of the invention, the allocation of the send buffer(s) (130) may involve mapping each of the send buffer(s) (130) to the correct Input/Output Memory Management Unit (IOMMU) associated with the host. In one embodiment of the invention, the send buffer(s) (130) are allocated using a slab allocator. In the aforementioned embodiment of the invention, the slab allocator includes functionality to dynamically resize the number of send buffer(s) (130).

In one embodiment of the invention, each of the send buffer(s) (130) is associated with a descriptor (not shown). Further, when the send buffer(s) (130) are allocated to a particular connection, each of the descriptors (not shown) associated with the allocated send buffer(s) (130) is linked to the connection (or more specifically, to the data structures used to represent the connection on the host). In one embodiment of the invention, once data in particular send buffer(s) (130) is no longer needed by the TOE (e.g., the data has been sent and acknowledged), the send buffer(s) (130) is freed such that it may be used again.

In one embodiment of the invention, an upper bound is fixed on the amount of send buffer(s) in use by one particular connection. When this upper bound is about to be exceeded for a connection, the application executing on the host may register with the TOE for a notification when one or more send buffer(s) are not in use anymore on this connection and then sleep until such a notification is received. In one embodiment of the invention, return of unused send buffers to the operating system can be delayed. This favors efficient reuse of the same buffers. The aforementioned process of freeing idle buffer(s) may be implemented when the amount of available send buffer(s) (130) is below a minimum threshold level. Flow control using the aforementioned data structures is discussed below.

In one embodiment of the invention, the receive buffer(s) (132) correspond to fixed-length anonymous buffer(s). The receive buffer(s) (132) are not initially associated with any particular connection. Once data is placed in the receive buffer(s) (132), then the receive buffer(s) are associated with a particular connection (i.e., the connection which received the data). However, the receive buffer(s) (132) is only temporarily associated with the connection, once the data in the receive buffer(s) has been consumed by the application executing on the host, the receive buffer(s) (132) are freed (i.e., the receive buffer(s) (132) are no longer associated with the connection). At this stage, the receive buffer(s) (132) may be reused by any connection. In one embodiment of the invention, the send buffer(s) (130) and the receive buffer(s) (132) are implemented using a ring buffering mechanism.

In one embodiment of the invention, the mirror of TOE connection registers (136) correspond to memory locations in the host memory (130), which are used to store data corresponding to the following registers: a state (138) register, a bytes sent count (140) register, and an incoming connection count (142) register. The content of the aforementioned registers is updated by the TOE from the corresponding TOE connection registers (120) which are located in TOE memory (102). More specifically, the TOE connection registers (120) in the TOE memory (102) include a state (150) register, a bytes sent count (152) register, and an incoming connection count (154) register.

In one embodiment of the invention, the state (150) register stores the current state (e.g., waiting to receive data, no connection, etc.) of the connection. In one embodiment of the invention, the host uses contents of the state (150) register (which is mirrored in the host memory) to determine whether to proceed with an operation (e.g., sending data to a receiver, etc.) or to abort the operation and return an error code to the host (or a process executing on the host, an application executing on the host which requested the operation).

In one embodiment of the invention, the bytes sent count (152) register stores the number of bytes that have been sent on the particular connection. In one embodiment of the invention, the bytes sent count (152) register is used by the host to verify that data stored in the send buffer(s) has been sent. In one embodiment of the invention, the incoming connection count (154) register stores the number of incoming connections. In one embodiment of the invention, the incoming connection count (154) register is used by the host to determine whether a new connection is ready. More specifically, the host can compare the current value of the incoming connection count (154) register (by checking the corresponding incoming connection count (142) register in the mirror of TOE connection registers (136)) with the previous value of the incoming connection count (154) register.

In one embodiment of the invention, the contents of the TOE connection registers (120) is mirrored into host memory (100) by the TOE using a direct memory access mechanism (DMA). Generally, DMA mechanisms enable data to be transferred from one memory location (or region) to another memory location (or region) without using a central processing unit (e.g., the host CPU (104), the TOE CPU (106), etc.). In one embodiment of the invention, the contents of the bytes sent count (140) register in the mirror of TOE connection registers (136) in the host memory (100) is not necessarily updated every time the corresponding TOE register value changes. Those skilled in the art will appreciate that the rate at which the bytes sent count (140) register in the mirror of TOE connection registers (136) in the host memory (100) is updated may depend on the implementation. In one embodiment of the invention, the remaining registers in the mirror of TOE connection registers (136) are updated when there is a state change. As an alternative to the above updating scheme, all registers in the mirror of TOE connection registers (136) in the host memory (100) may be updated in response to the occurrence of particular events in the system (e.g., receiving data, sending data, establishing a connection, etc.).

As discussed above, the host memory (100) includes per-processor data structures (112). In one embodiment of the invention, the per-processor data structures (112) include a request queue (144) and an event queue (146). In one embodiment of the invention, the request queue (144) and the event queue (146) are located in the host memory (100) but are accessible to the TOE. In one embodiment of the invention, the request queue (144) and the event queue (146) are implemented as ring buffer(s). In one embodiment of the invention, the host uses the request queue (144) to communicate various types of requests to the TOE (101). For example, the host may use the request queue (144) to notify the TOE that the host has data to send to the network. Further, the host may use the request queue (144) to register notifications with the TOE. For example, the host may post a notification request on the request queue (144), which requests the TOE to notify (usually using an event—discussed below) the host when a particular event occurs (e.g., data is received).

Additionally, the host may use the request queue (144) to control the TOE. For example, if the host (or an application executing on the host) is not consuming incoming data (i.e., data received from the network) at a fast enough rate, then the host may post a request on the request queue (144) for the TOE to reply on flow control to prevent the sender from sending any more date. At some later point, the host may post a subsequent request on the request queue (144) for the TOE to start receiving data. Those skilled in the art will appreciate that when the host requests the TOE to stop receiving incoming data, the TOE may not stop receiving data immediately, rather the TOE may continue to buffer(s) incoming data for a certain period of time (e.g., the length of the TCP advertise window) prior to ceasing to receive data. In one embodiment of the invention, the TOE may buffer the incoming data in the incoming packet buffer (116).

In one embodiment of the invention, the TOE uses the event queue (146) to communicate events to the host in an asynchronous manner. In one embodiment of the invention, two classes of events may exist: (1) events that are triggered following a request (discussed above) from the host and (2) events that are spontaneously generated by the TOE (i.e., events which are not triggered in response to a request from the host). For example, in one embodiment of the invention, every time a receive buffer(s) (130) is filled by the TOE, the TOE posts an event on the event queue.

In one embodiment of the invention, the number of entries in the request queue (144) and the event queue (146) is set at a specific number (though not necessarily the same number). Because the host and the TOE include mechanisms which implement flow control on the request queue (144) and the event queue (146), there is a limit on the number of requests that may be posted to the request queue (144) and a limit on the number of events that may be posted to the event queue (146). In one embodiment of the invention, the number of entries in the request queue (144) and the event queue (146) is set at a specific number (though not necessarily the same number).

The following describes embodiments of flow control that may be implemented on the request queue (144). In one embodiment of the invention, each time the host posts a new request on the request queue (144), the host notifies the TOE by writing, typically using a programmed I/O (PIO) write, to a last descriptor posted register (160) in the TOE memory (102). Similarly, after a request is consumed (i.e., serviced) by the TOE, the TOE updates a last descriptor consumed register (162) in the TOE memory (102). As the host posts requests on the request queue (144), the host keeps track of the number of requests posted to the request queue (144). Prior to placing requests on the request queue (144), the host determines whether any available entries exist in request queue (144). The host may determine whether any available entries exist in the request queue (144) by reading, typically using a PIO read, the last descriptor consumed register (162). Because the host is aware of the last request that was posted, the last request that was serviced, and the number of requests posted, the host may determine whether an available entry exists in the request queue (144). Note that the host does not need to read the last descriptor consumed register for every request it posts. Rather, the host can cache the value of the last descriptor consumed register and effectively read it only when the cached value leads it to find no free entry in the request queue (144).

As an alternative, in one embodiment of the invention, the host may determine whether any available entries exist on the request queue (144) by comparing the number of incoming events with the number of requests posted to the request queue (144) because each event on the event queue (146) is associated with a request on the request queue (144). Regardless of which flow control embodiment is used, if the host determines that the request queue (144) may overflow, then the host may temporarily stop posting requests to the request queue (144).

The following describes an embodiment of flow control that may be implemented on the event queue (146). As discussed above, two classes of events may exist: (1) events that are triggered following a request (discussed above) from the host and (2) events that are spontaneously generated by the TOE. In one embodiment of the invention, the number of events generated by the TOE is bounded. For example, the number of events that are not triggered in response to a request from the host is bounded by the number of receive buffer(s) (132) associated with the particular host CPU (e.g., host CPU (104)). Because the host can control the number of requests posted on the event queue which trigger events and because the host is aware of the maximum number of bounded events (i.e., events that are generated by the TOE), the host can determine when, at worst, an overflow of the event queue (146) may occur. Based on when, at worst, an overflow of the event queue (146) may occur, the host may stop posting requests on the request queue (144) that would trigger an event. At some later time, the host may begin to post requests that would trigger an event.

As an alternative, the host may notify the TOE that an event has been de-queued (i.e., removed from the event queue (146) by the host)) from the event queue (146). The host may notify the TOE every time an event is de-queued by writing to register in the TOE memory (102). The TOE may use the aforementioned register to determine when, at worst, the event queue (146) may overflow. If the TOE determines that the event queue (146) is likely to overflow, the TOE may temporarily stop receiving data from the network (110), aggregate multiple events into a single event, or take other actions to prevent the event queue (146) from overflowing.

Figure 3:
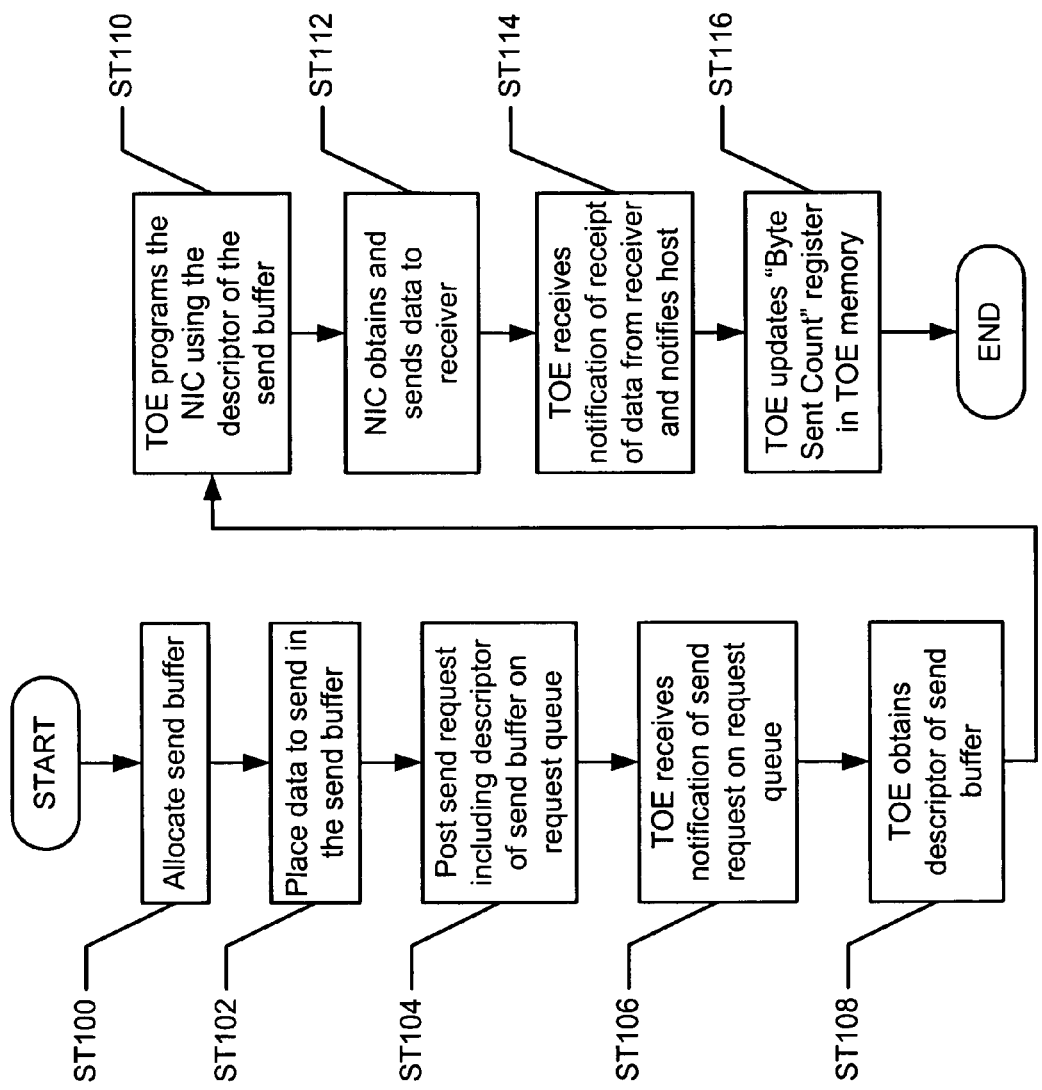
FIGS. 3 and 4 show flowcharts in accordance with one embodiment of the invention.

FIG. 3 shows a flowchart in accordance with one embodiment of the invention. Initially, one or more send buffer(s) are allocated in host memory (using embodiments discussed above) (ST100). Data to send to a receiver is subsequently placed in the send buffer(s) (ST102). Once the data has been placed in the send buffer(s), the host posts a request on the request queue (ST104). In one embodiment of the invention, the request includes a descriptor (or descriptors, if there is more than one send buffer being sent) associated with the send buffer(s) that includes the data. Once the request has been posted in the request queue, the host notifies the TOE by writing, typically using a PIO write, to the last descriptor posted register in the TOE memory (ST106).

The TOE subsequently obtains the descriptor (and, in some cases, additional information associated with the send request) from the request queue (ST108). In one embodiment of the invention, the descriptor (and, in some cases, additional information associated with the send request) is obtained from the request queue using a DMA read. Once the TOE has obtained the descriptor (and, in some cases, additional information associated with the send request), the TOE proceeds to program a NI operatively connected to the TOE (ST110). In one embodiment of the invention, the NI is programmed by the TOE using the descriptor (and, in some cases, additional information associated with the send request). The TOE programs the NI such that data is obtained directly from the send buffer(s) (typically using a DMA read). Once the NI has been programmed, the NI proceeds to obtain and send the data to the receiver (ST112).

At this stage the TOE waits for notification (e.g., TCP acknowledgements) from the receiver that the data has been received. Once the notification of receipt has been received, the TOE may proceed to notify the host (ST114). Finally, the TOE updates the bytes sent count register in the TOE memory (ST116). In one embodiment of the invention, each send request includes a special flag, which requests the TOE to update the mirror of the TOE connection registers with the values of the corresponding registers located in the TOE. In one embodiment of the invention, the mirror of the TOE connection registers is updated by the TOE using a DMA write.

Figure 4:
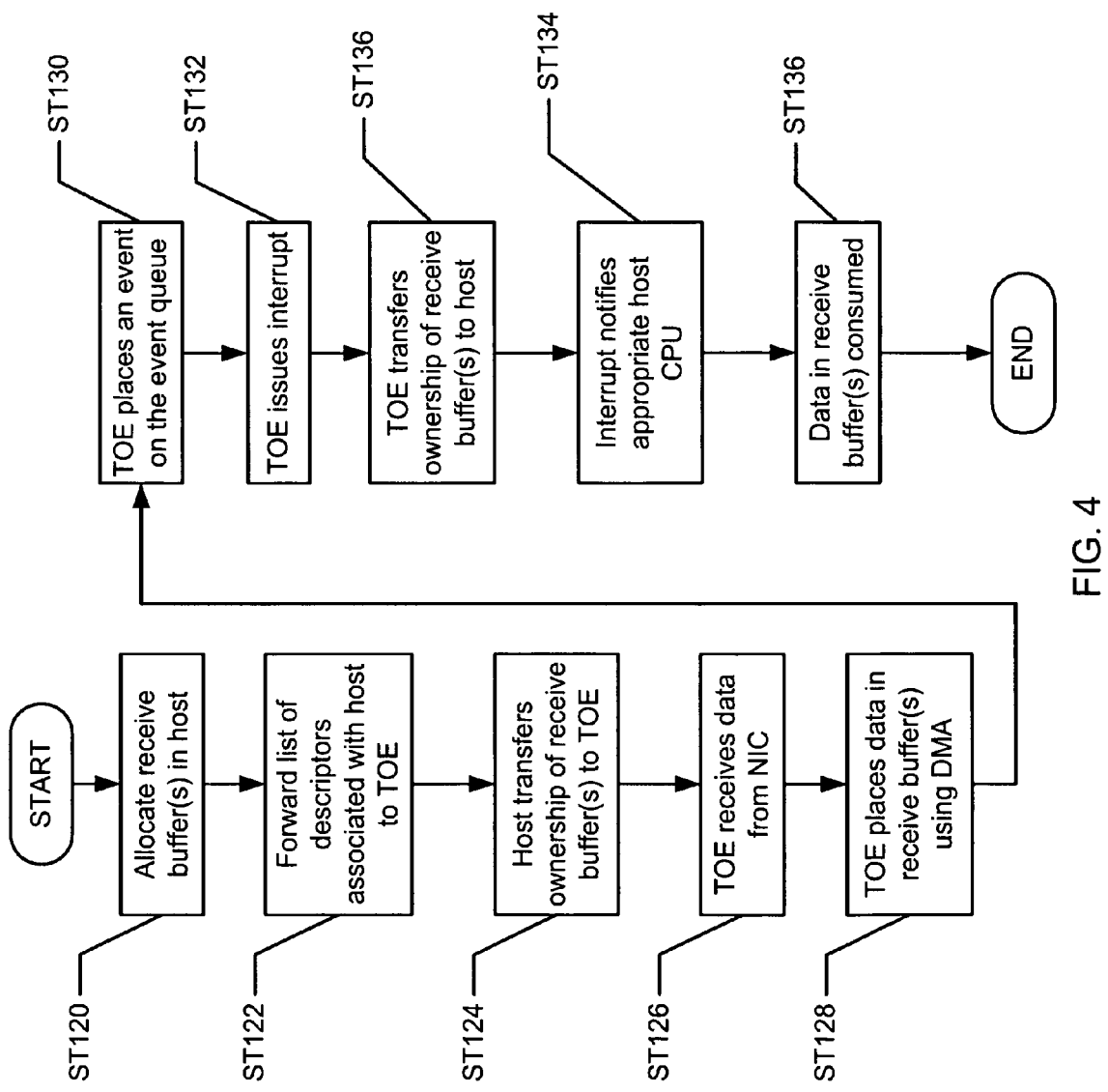

FIG. 4 shows a flowchart in accordance with one embodiment of the invention. Initially, the host allocates anonymous receive buffer(s), typically in a dedicated area within the host memory (ST120). The host subsequently forwards, via the request queue, information about the location of the anonymous receive buffer(s) within the host memory (ST122). The host then transfers ownership of the anonymous receive buffer(s) to the TOE (i.e., the host no longer controls the anonymous receive buffer(s); however, the anonymous receive buffer(s) are still maintained in the host memory) (ST124). At this stage the TOE is ready to receive data from the network. Those skilled in the art will appreciate that ST120-ST124 may be repeated while ST126-ST136 are being performed (i.e., additional anonymous receive buffer(s) may be allocated).

At some point after ST124 has been performed, the TOE receives data from the network via the NI (ST126). In one embodiment of the invention, the data received from the network is initially stored in the incoming packets buffer within the TOE memory.

Once the TOE has received the data from the network, the TOE proceeds to place the data in one or more anonymous receive buffer(s) (ST128). In one embodiment of the invention, the TOE places the data in the anonymous receive buffer(s) using a DMA write operation. After the data has been placed in the anonymous receive buffer(s), the TOE proceeds to post an event on the event queue (ST130). In one embodiment of the invention, the event includes a reference to the connection on which the data was received, a reference to the anonymous receive buffer(s) (typically a descriptor associated with the anonymous receive buffer(s)), and a field indicating the amount of data stored in the corresponding anonymous receive buffer(s). In one embodiment of the invention, the event is posted on the event queue using a DMA write operation.

In one embodiment of the invention, once the TOE posts the event on the event queue, the TOE issues an interrupt to the appropriate CPU (i.e., the CPU with which the connection is associated) (ST132). The TOE then transfers control of the anonymous receive buffer(s) back to the host. The interrupt subsequently notifies the appropriate host CPU (ST134). The data in the anonymous receive buffer(s) is subsequently consumed (ST136). In one embodiment of the invention, an application consumes the data.

Figure 5:
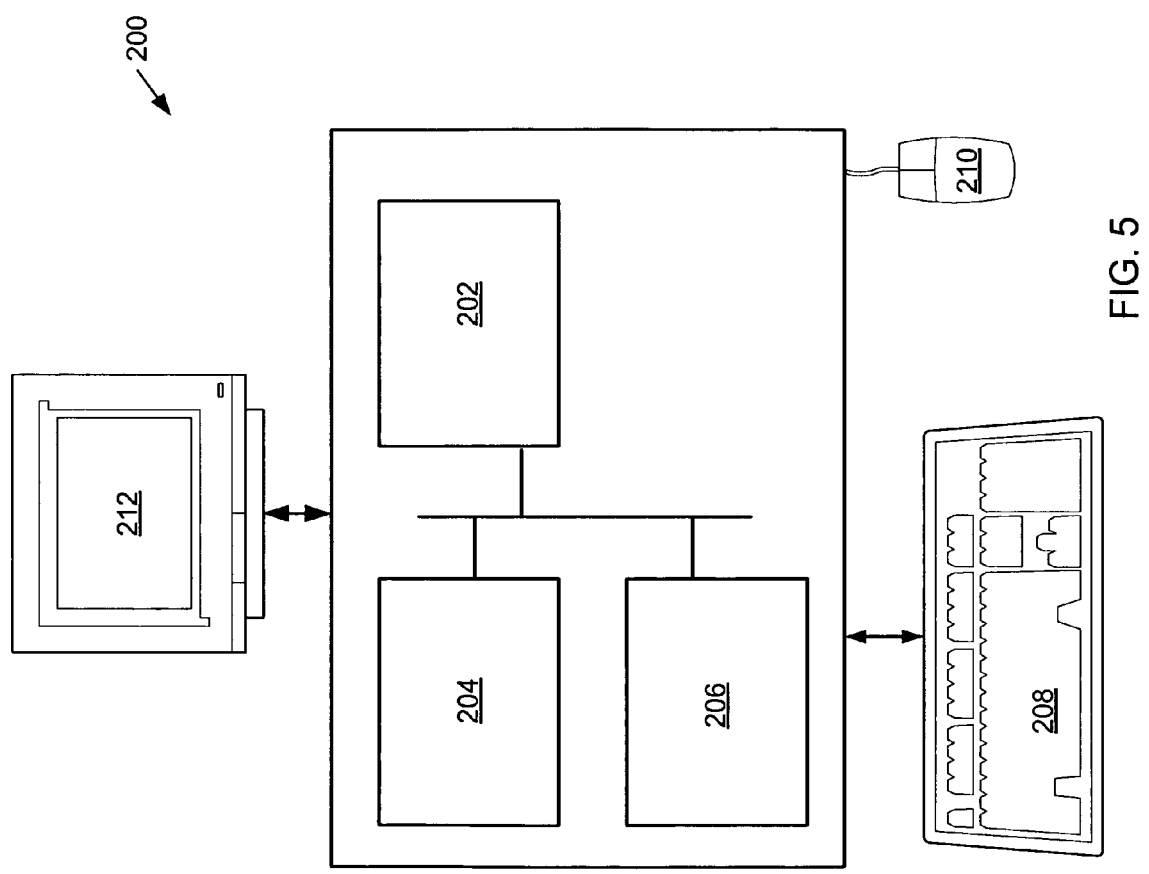
FIG. 5 shows a computer system in accordance with one embodiment of the invention.

An embodiment of the invention may be implemented on virtually any type of computer regardless of the platform being used. For example, as shown in FIG. 5, a networked computer system (200) includes a processor (202), associated memory (204), a storage device (206), and numerous other elements and functionalities typical of today's computers (not shown). The networked computer (200) may also include input means, such as a keyboard (208) and a mouse (210), and output means, such as a monitor (212). The networked computer system (200) is connected to a local area network (LAN) or a wide area network via a network interface connection (not shown). Those skilled in the art will appreciate that these input and output means may take other forms. Further, those skilled in the art will appreciate that one or more elements of the aforementioned computer (200) may be located at a remote location and connected to the other elements over a network. Further, software instructions to perform embodiments of the invention may be stored on a computer readable medium such as a compact disc (CD), a diskette, a tape, a file, or any other computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
   a host comprising at least one per-connection data structure and at least one per-processor data structure, wherein the at least one per-connection data structure is associated with a connection, and wherein the at least one per-processor data structure comprises a request queue; and an offload engine operatively connected to the host, comprising a state register identifying a current state of the connection, a bytes sent count register storing a number of bytes sent on the connection, and an incoming connection count register storing a number of incoming connections, and functionality to update the at least one per-connection data structure in the host, wherein the offload engine is configured to send and receive network data on the connection, wherein the host and the offload engine communicate using the at least one per-processor data structure, wherein the offload engine communicates a status of the connection to the host using the state register, the bytes sent count register, and the incoming connection count register, wherein the host posts a new request in the request queue and notifies the offload engine of the new request by writing to a last posted descriptor register in the offload engine wherein the at least one per-connection data structure comprises a mirror of the state register, a mirror of the bytes sent count register, and a mirror of the incoming connection count register.

2. The system of claim 1, wherein the at least one per-processor data structure further comprises an event queue.

3. The system of claim 2, wherein the host comprises functionality to post a send request on the request queue.

4. The system of claim 2, wherein the send request comprises a descriptor of a buffer that comprises the data to be sent.

5. The system of claim 4, wherein the descriptor is used to program a network interface card.

6. The system of claim 2, wherein the request queue is used to implement flow control in the offload engine.

7. The system of claim 2, wherein the request queue is used to implement flow control in the host.

8. The system of claim 2, wherein the offload engine comprises functionality to post an event on the event queue to notify the host that data has been received on the connection.

9. The system of claim 8, wherein the host is asynchronously notified using the event queue.

10. The system of claim 8, wherein the offload engine issues an interrupt after placing the event on the event queue.

11. The system of claim 10, wherein the event comprises at least one selected from the group consisting of an error event and a notification event.

12. The system of claim 1, wherein the offload engine further comprises a last descriptor consumed register.

13. The system of claim 1, wherein the at least one per-connection data structure further comprises at least one selected from the group consisting of a send buffer and a receive buffer.

14. The system of claim 13, wherein the receive buffer belongs to a pool of anonymous buffers pre-allocated by the host and wherein the host transfers ownership of the pool of anonymous buffers to the offload engine.

15. The system of claim 13, wherein the send buffer and the receive buffer are implemented using a ring buffering mechanism.

16. The system of claim 1, wherein the mirror of state register, the mirror of the bytes sent count register, and the mirror of the incoming connection count register are updated using a direct memory access mechanism.

17. A method for receiving data, comprising:

allocating an anonymous receive buffer in a host, wherein the anonymous receive buffer is associated with a descriptor;

sending the descriptor to an offload engine operatively connected to the host using a request queue, wherein the request queue is located on the host and is accessible by the offload engine;

notifying the offload engine by updating a last descriptor posted register in the offload engine;

transferring ownership of the anonymous receive buffer to the offload engine;

receiving the data from a network interface card by the offload engine;

storing the data in the anonymous receive buffer;

placing an event on an event queue, wherein the event queue is located on the host and the event comprises a reference to a connection upon which the data was received, a reference to the anonymous receive buffer, and an amount of data stored in the anonymous receive buffer;

issuing an interrupt to the host by the offload engine;

transferring ownership of the anonymous receive buffer from the offload engine to the host;

upon receiving the interrupt, notifying a processor on the host associated with the connection that data has been received on the connection; and consuming data in the anonymous receive buffer, wherein the offload engine comprises a state register identifying a current state of the connection and an incoming connection count register storing a number of incoming connections, and wherein the host comprises at least one per-connection data structure comprising a mirror of the state register and a mirror of the incoming connection count register.

18. A method for sending data, comprising:

placing the data in a send buffer, wherein the send buffer is located on a host;

posting a send request on the request queue, wherein the send request comprises a descriptor of the send buffer, wherein the request queue is located on the host;

notifying an offload engine of the send request by updating a last descriptor posted register in the offload engine, wherein the offload engine is operatively connected to the host;

upon notification of the send request, obtaining the descriptor from the host by the offload engine; programming a network interface card to send the data directly from the send buffer to a receiver using the descriptor, sending the data to the receiver by the network interface card using a connection to the receiver;

receiving notification of receipt of the data from the receiver by the offload engine; and updating a bytes sent count register in the offload engine associated with the connection, wherein the offload engine comprises a state register identifying a current state of the connection and an incoming connection count register storing a number of incoming connections, and wherein the host comprises at least one per-connection data structure including a mirror of the state register, a mirror of the bytes sent count register, and a mirror of the incoming connection count register.

* * * * *

UNITED STATES PATENT AND TRADEMARK OFFICE
CERTIFICATE OF CORRECTION

PATENT NO. : 7,647,436 B1  
APPLICATION NO. : 11/118004  
DATED : January 12, 2010  
INVENTOR(S) : Westrelin et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 740 days.

Signed and Sealed this

Sixteenth Day of November, 2010

David J. Kappos  
*Director of the United States Patent and Trademark Office*